United States Patent
Lu et al.

(10) Patent No.: US 10,367,518 B2
(45) Date of Patent: Jul. 30, 2019

(54) APPARATUS AND METHOD FOR SINGLE TEMPERATURE SUBTHRESHOLD FACTOR TRIMMING FOR HYBRID THERMAL SENSOR

(71) Applicant: Intel Corporation, Santa Clara, CA (US)

(72) Inventors: Cho-Ying Lu, Hillsboro, OR (US); Hyung-Jin Lee, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/891,092

(22) Filed: Feb. 7, 2018

(65) Prior Publication Data

US 2019/0044528 A1    Feb. 7, 2019

(51) Int. Cl.
| | |
|---|---|
| *G01K 7/01* | (2006.01) |
| *H03M 1/12* | (2006.01) |
| *G01K 7/14* | (2006.01) |
| *G01K 15/00* | (2006.01) |
| *H03M 1/10* | (2006.01) |
| *H03M 1/46* | (2006.01) |

(52) U.S. Cl.
CPC ............ *H03M 1/1061* (2013.01); *G01K 7/01* (2013.01); *G01K 7/14* (2013.01); *G01K 15/005* (2013.01); *H03M 1/1004* (2013.01); *H03M 1/1019* (2013.01); *H03M 1/1028* (2013.01); *H03M 1/1215* (2013.01); *H03M 1/462* (2013.01); *G01K 2219/00* (2013.01)

(58) Field of Classification Search
None
See application file for complete search history.

(56) References Cited

U.S. PATENT DOCUMENTS

| | | | |
|---|---|---|---|
| 2008/0030259 A1* | 2/2008 | Scheuerlein | G01K 7/01 327/513 |
| 2015/0063420 A1* | 3/2015 | Cho | G01K 7/01 374/170 |
| 2016/0138978 A1* | 5/2016 | Eberlein | G01K 7/01 374/170 |
| 2016/0238464 A1* | 8/2016 | Eberlein | G01K 7/01 |

FOREIGN PATENT DOCUMENTS

WO    WO-2015084410 A1 *  6/2015  ............ G01K 7/01

OTHER PUBLICATIONS

Pertijs, M. et al., "Low-Cost Calibration Techniques for Smart Temperature Sensor", IEEE Sensors J., vol. 10, pp. 1098-1105, Jun. 2010, (8 pages).

* cited by examiner

*Primary Examiner* — Howard Williams
(74) *Attorney, Agent, or Firm* — Green, Howard & Mughal LLP

(57) ABSTRACT

An apparatus is provided which comprises: a thermal sensor comprising one or more n-type devices or p-type devices that suffer from subthreshold factor variation, wherein the thermal sensor is to generate an output digital code representing a temperature; and a calibration circuitry coupled to the thermal sensor, wherein the calibration circuitry is to trim the effects of subthreshold factor variation from the output digital code.

20 Claims, 11 Drawing Sheets

APPARATUS AND METHOD FOR SINGLE TEMPERATURE SUBTHRESHOLD FACTOR TRIMMING FOR HYBRID THERMAL SENSOR

BACKGROUND

Accurate sensors to monitor temperature are used for thermal management of micro-processors. Most System-on-Chip (SoC) solutions use some kind of temperature tracking, in order to optimize or control the performance of certain functions. At times, where phones merge with mobile computers, relevant applications of thermal sensors include also mixed-signal functions, like RF (radio frequency) or audio power amplifiers. Some thermal sensors exhibit a sensing slope between temperature and an output code, where the sensing slope has full dependency on subthreshold factor (SF) of a metal oxide semiconductor field effect transistor (MOSFET). This SF is a process technology dependent parameter that has wide variation during manufacturing. This wide variation in the SF leads to sensing inaccuracies.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
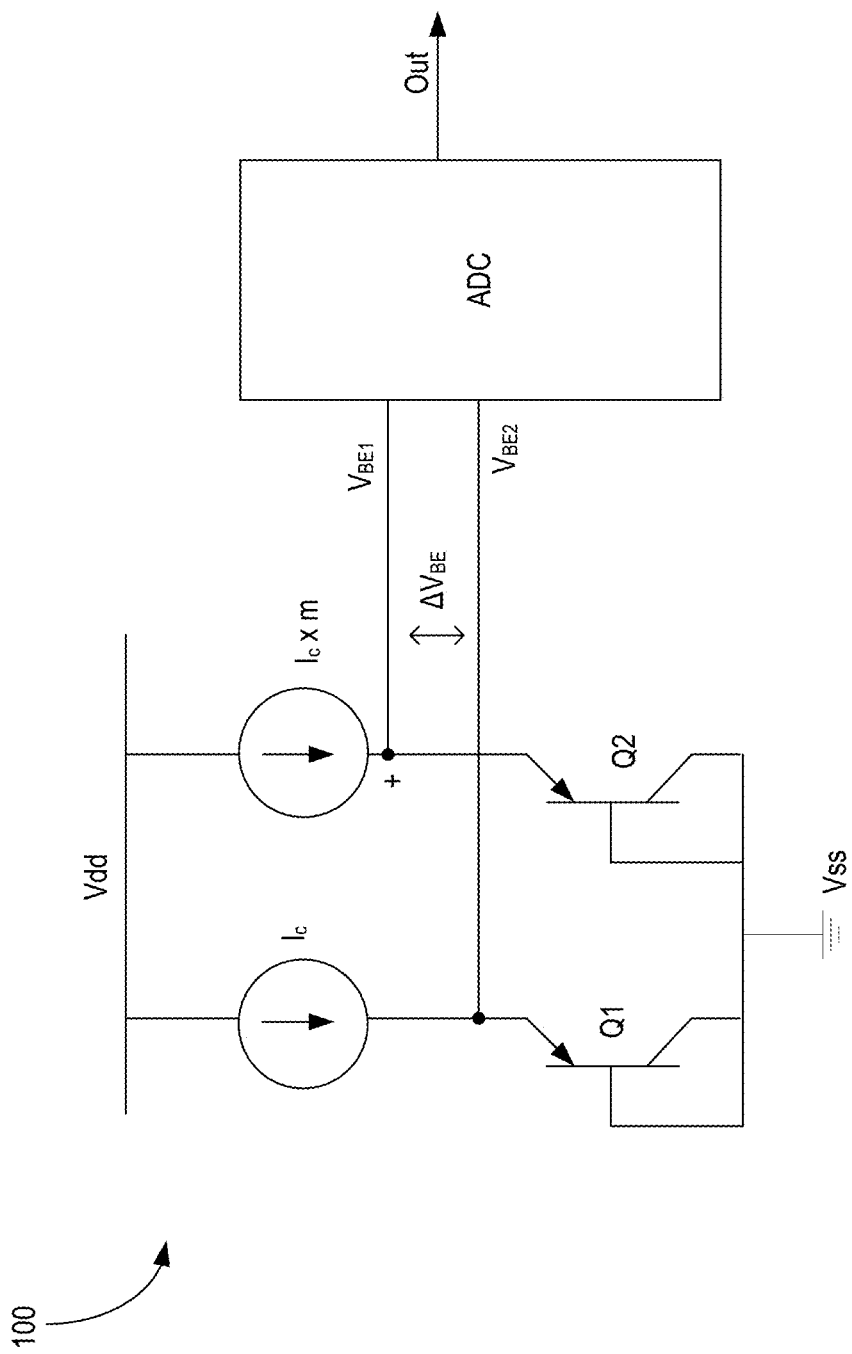
FIG. 1 is a conventional bi-polar junction transistor (BJT) based thermal sensor.

FIG. 1 is a conventional BJT based thermal sensor 100. Thermal sensor 100 includes a first PNP BJT Q1 with base and collector terminals connected to ground (Vss), and emitter terminal connected to a first current source Ic (which is coupled to power supply Vdd). Thermal sensor 100 further includes a second PNP BJT Q2 with base and collector terminals connected to ground (Vss), and emitter terminal connected to a second current source to provide current which is multiple of current Ic i.e., Ic×m, where 'm' is a multiple. The emitters of both Q1 and Q2 have voltages $V_{BE1}$ and $V_{BE2}$ respectively, which are provided to the ADC.

A conventional approach for a temperature measurement uses a voltage which increases linearly with temperature. This so-called PTAT (proportional-to-absolute-temperature) voltage is typically generated from a difference of two base-emitter voltages (i.e., $\Delta V_{BE}$) of PNP BJTs Q1 and Q2, which are biased with different current densities (e.g. ratio 1:m). An actual temperature value can be extracted by comparing the PTAT voltage (e.g., ΔVbe) to a temperature independent reference (e.g., a bandgap). In practice, this is achieved by measuring the PTAT voltage (or a multiple of it) directly with an ADC, which in turn includes (or is controlled by) such reference. These circuits may achieve high precision after trimming, but the solution is very complex. Multi-placement is therefore costly.

Multiple hot-spot sensing using conventional thermal sensors can be performed in deep-submicron technologies and may achieve a significantly smaller size e.g., by using remote diodes away from the core thermal sensor. However, the absence of error compensation results in reduced accuracy, with still average power consumption. Some alternative (non-BJT) concepts yield more "digital-alike" circuits, e.g., by using frequency of ring oscillators as thermal reference. But the assumed advantage towards technology scaling manifests actually as a handicap, because the characteristics of MOS (metal-oxide semiconductor) devices vary strongly with process. Poor linearity and spread is discouraging for using such concepts in volume production.

To address the poor linearity and spread, hybrid thermal sensors (HTS) can be used. FIGS. 2-5 provide some examples of a modified HTS which is operable to compensate for SF. The hybrid thermal sensor generates a PTAT (proportional-to-absolute temperature) current and a CTAT (complementary-to-absolute temperature) current, and uses their difference as a measure for actual temperature. The thermal sensor comprises a nonlinear feedback loop which provides inherently the function of a current comparator, and a digital output. The compatibility to dual-well process is achieved by generating the PTAT signal through MOS devices operated in weak inversion, and the CTAT signal through a bipolar junction (i.e., diode).

The thermal sensor works with a successive approximation register (SAR) type analog-to-digital converter (ADC), which is realized by sequentially adjusting the temperature threshold, as a function of the digital output. This hybrid thermal sensor is less sensitive to process variations and especially MOS mismatch compared to traditional thermal sensors (e.g., FIG. 1). However, the hybrid thermal sensor exhibits a sensing slope between temperature and an output code, where the sensing slope has full dependency on subthreshold factor (SF) of a MOSFET. This SF is a process technology dependent parameter that has wide variation during manufacturing. This wide variation in the SF leads to sensing inaccuracies.

In order to alleviate the accuracy degradation, the current solutions are to either increase the transistor size to reduce the device variation ($\sigma \propto 1/\sqrt{Area}$) or to implement 2-temperature-point trimming procedure to estimate the process dependent sensing slope. The former solution with the increased transistor size reduces the silicon efficiency and consumes more power due to larger parasitic capacitances and resistances, while the later solution with 2-temperature-point trimming increases test time by over 2× for two different temperature points as well as the testing cost associated with the requirement of special temperature control module in testing floor.

Some embodiments implements Built-In-Self-Test (BIST) apparatus providing well-controlled known (e.g., temperature independent) reference in the HTS to replace CTAT coefficient from BJT or diode during a trimming procedure. This replacement results in a direct relation between SF in an actual Device under Test (DUT) and in the sensing model with equations. In some embodiments, the actual SF parameter can be learned through the procedure with a reference from the sensing model, stored in non-violate memory, and compensated in the digital domain.

There are many technical effect of the various embodiments. For example, the modified HTS can fully support Moore's law since the device upsizing to reduce SF variation is no longer a design consideration and the technique eliminates the requirement of temperature control modules in the test floor since the trimming procedure is not sensitive to any specific temperature and does not rely on the temperature slope of the sensor. The product cost can be, therefore, reduced significantly. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

It is pointed out that elements of a figure having the same reference numbers (or names) as the elements of any other figure can operate or function in any manner similar to that described, but are not limited to such.

Figure 2:
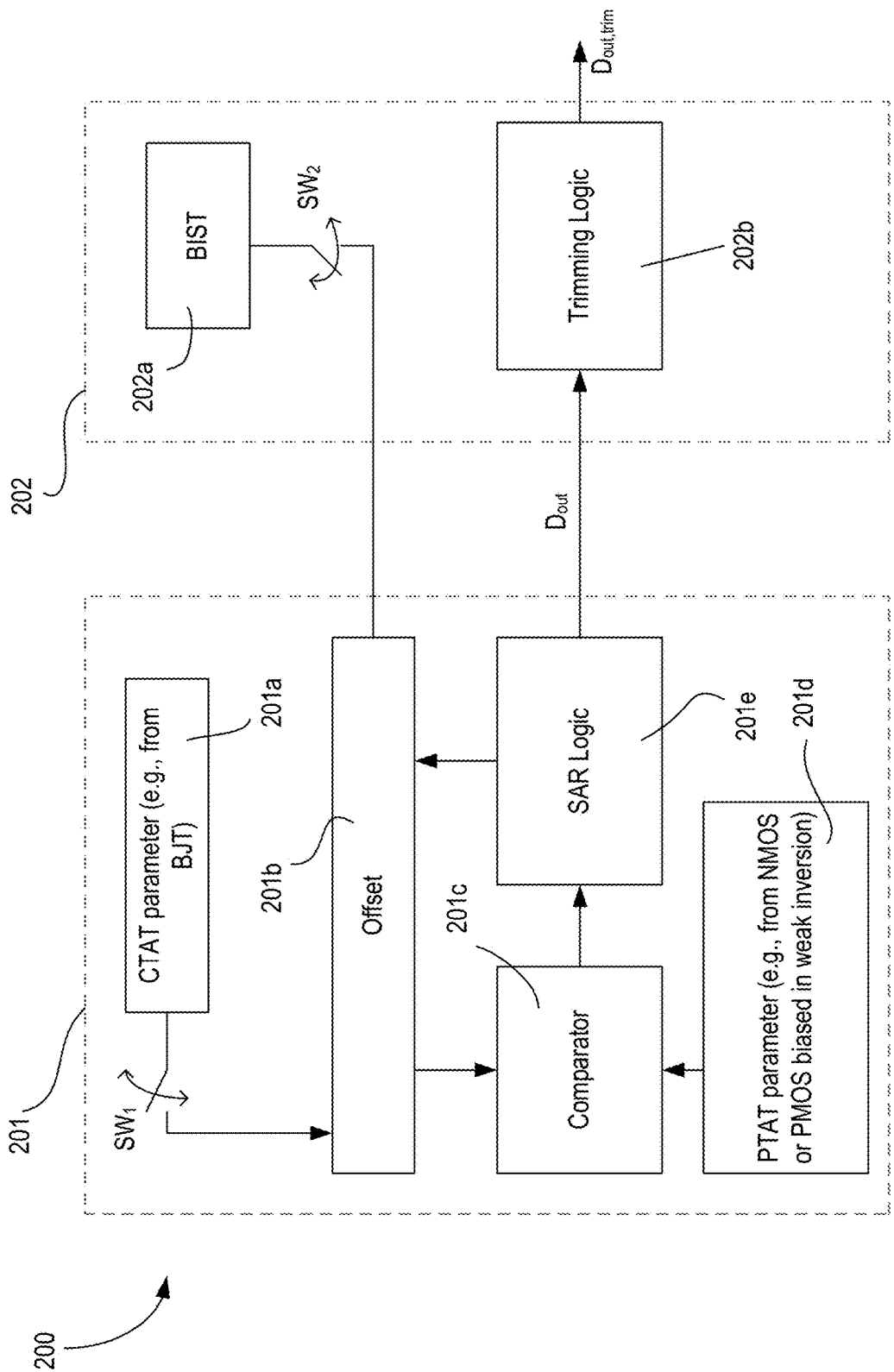
FIG. 2 illustrates a high-level apparatus for trimming subthreshold factor of a thermal sensor, in accordance with some embodiments of the disclosure.

FIG. 2 illustrates a high-level apparatus 200 for trimming subthreshold factor of a thermal sensor, in accordance with some embodiments of the disclosure. In some embodiments, apparatus 200 comprises thermal sensor 201 and calibration circuitry 202. In some embodiments, thermal sensor 201 comprises switche $SW_1$, complementary-to-absolute-temperature (CTAT) parameter 201a (e.g., voltage from a BJT), offset circuitry having an offset value 201b, comparator 201c, proportional-to-absolute-temperature (PTAT) parameter (e.g., voltage from one or more n-type devices or p-type devices biased in weak inversion), and SAR logic 201e. In some embodiments, calibration circuitry 202 comprises switch $SW_2$, built-in-self-test (BIST) circuitry 202a, finite state machine (not shown), and trimming logic 202b.

In some embodiments, during normal operation switch $SW_1$ is closed (e.g., turned on), and the thermal sensor 201 detects the temperature by comparing the PTAT voltage from subthreshold n-type device(s) and the complementary-to-absolute-temperature (CTAT) voltage from BJT with the comparator 201c and SAR logic 201e to binary search the offset value 201b applied to the CTAT parameter to equalize both voltages. The dependency of the output code $D_{out}$ to process and circuit parameters can be expressed as Eq. 1.

$$(255 - D_{out}) = J\left(\frac{H}{nLT} - 1\right) \quad \text{Eq. 1}$$

where J and L are well-controlled circuit parameters, H is the CTAT parameter from a BJT, n is the subthreshold factor (SF) of one or more n-type devices or p-type devices, and T is the temperature. From Eq. 1, the SF variation during manufacturing will change the slope between $D_{out}$ and T and degrade the sensing accuracy.

In some embodiments, BIST circuitry 202a is to generate the temperature-independent DC voltages which are added to the offset value 201b or used instead of the offset value 201b. In some embodiments, BIST circuitry 202a is turned on during a trimming phase (e.g., calibration mode where SF is trimmed). In some embodiments, the external voltage is to isolate the SF parameter from the effect of BJT variation such that the SF variation can be learned and alleviated. The additional trimming logic 202b is to apply a correction equation to compensate the detected SF variation, in accordance with some embodiments.

To quantify the SF variation and trim the SF effect out, switch $SW_2$ is turned on and switch $SW_1$ is turned off to switch the connection from CTAT generation block (BJT) to BIST circuitry 202a during room temperature trimming procedure. The BIST circuitry 202a provides two different well-controlled and stable DC voltages ($P_1$ and $P_2$) to the HTS system and the corresponding output codes $D_{out1}$ and $D_{out2}$ can now be expressed as Eq.2 and Eq.3, respectively. Here, $T_{room}$ is room temperature.

$$(255 - D_{out}) = J\left(\frac{P_1}{nLT} - 1\right) \quad \text{Eq. 2}$$

$$(255 - D_{out}) = J\left(\frac{P_2}{nLT} - 1\right) \quad \text{Eq. 3}$$

By subtracting Eq.2 with Eq.3, an output code delta ($\Delta D_{out}$) can be achieved and expressed as Eq.4.

$$\frac{\Delta D_{out,DUT}}{\Delta D_{out,sim}} = \frac{n_{model}}{n_{DUT}} \quad \text{Eq. 5}$$

With the knowledge of actual SF in an individual die, the trimming equation built in the trimming logic can correct the sensing slope and offset variation by using the Eq.6.

$$D_{out\_trim} = (D_{out} - D_{out@T_{room}}) * \frac{n_{DUT}}{n_{sim}} + D_{out,sim@T_{room}} \quad \text{Eq. 6}$$

In some embodiments, Eq. 6 is stored in a non-volatile memory and used by firmware or software to trim the SF. In some embodiments, Eq. 6 is provided to outside equipment manufacturers (OEMs) for them to compensate for SF before selling the thermal sensors. Here, $D_{out}$ and $D_{out\_trim}$ are the output codes of Design under Test (DUT) before and after trimming under various temperature, respectively. $D_{out@Troom}$ is the output code of DUT at room temperature and $D_{out,sim@Troom}$ is the output code at room temperature from pre-silicon simulation, for example. The first term on the right of Eq.6 can correct the temperature slope change due to the SF variation, and the second term can compensate the code offset at room temperature.

In the following circuit implementations, the normal operation of the thermal sensor is described first and then the calibration scheme is described using calibration circuitry 202 and switches $SW_1$ and $SW_2$.

Figure 3:
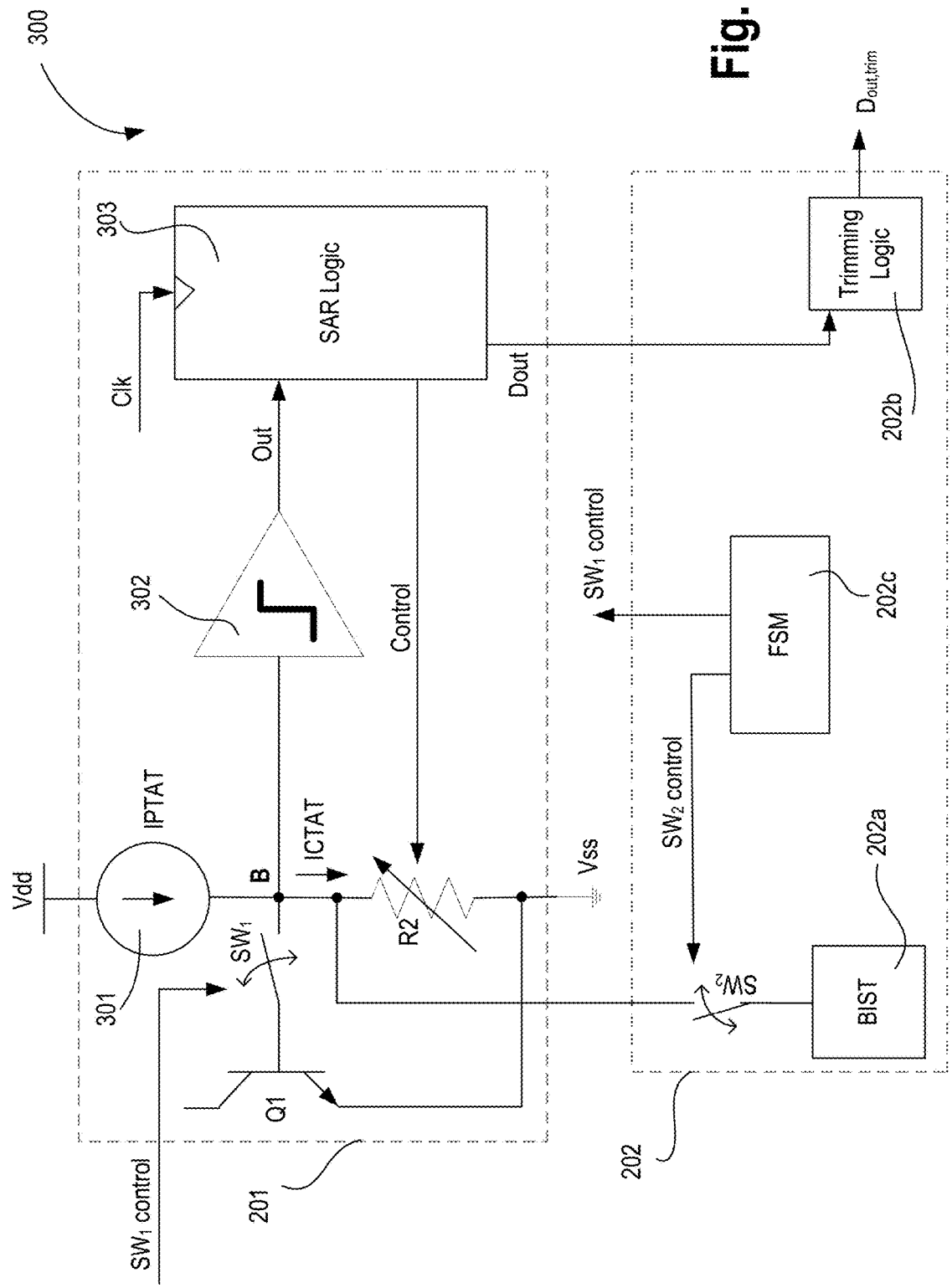
FIG. 3 illustrates a high level circuit architecture of a thermal sensor with SAR (successive approximation register) type analog-to-digital converter (ADC) and resistive digital-to-analog converter (DAC), and apparatus for trimming SF of the thermal sensor, in accordance with some embodiments of the disclosure.

FIG. 3 illustrates a high level circuit architecture 300 of a thermal sensor 201 with SAR (successive approximation register) type ADC and resistive digital-to-analog converter (DAC), and apparatus 202 for trimming subthreshold factor of the thermal sensor, in accordance with some embodiments of the disclosure.

The thermal sensor 201 of architecture 300 comprises switch $SW_1$, a first current source 301, a second current source realized as a DAC based resistor R2, current comparator 302, SAR type ADC logic 303, and BTJ transistor Q1. The apparatus 202 for trimming SF of the n-type device(s) of the thermal sensor 201 comprises switch $SW_2$, BIST 202a, Trimming Logic 202b, and finite state machine (FSM) 202c. The FSM 202c generates the controls ($SW_1$ control and $SW_2$ control) to switches $SW_1$ and $SW_2$, respectively. While the switches are shown as distributed between the thermal sensor 201 and apparatus 200, the switches can be in both in the thermal sensor in accordance with various embodiments. The switches SW1 and SW2 can be implemented in pass-gates, analog multiplexers, or transmission gates.

In some embodiments, the first current source 301 is coupled to supply Vdd, node B and switch $SW_1$. In one embodiment, resistor R2 is coupled to node B and ground (i.e., Vss). The base terminal of Q1 is coupled to node B via switch $SW_1$ controllable by $SW_1$ control from FSM 202c, the emitter terminal of Q1 is coupled to Vss, and the collector terminal is coupled to another current source (not shown). The current comparator 302 has an input coupled to node B and a one-bit output "Out" which is received by SAR type ADC logic 303. Here, SAR type ADC logic 303 generates a Control signal (e.g., n-bit signal where 'n' is an integer greater than one) to control resistance of resistor R2. The Control signal also indicates the temperature "Temp."

The operating principle of architecture 300 is based on a current-mode technique which avoids errors introduced by device mismatch, according to some embodiments. The current-mode technique of architecture 300 is in contrast to traditional thermal sensor solutions, which mostly use voltages, either by direct measurement or through conversion to frequency. During normal thermal sensing operation, switch $SW_1$ is closed connecting the base terminal of transistor Q1 with node B, which switch $SW_2$ is open such that it disconnects the BIST circuitry 202a from the sensor 201.

In some embodiments, temperature sensing is performed by subtracting two currents at node B with opposite temperature coefficients—a precise PTAT current (IPTAT) provided by first current source 301 having positive temperature coefficient and a CTAT current (ICTAT) which is generated by resistor R2 across a $V_{BE}$ voltage of bipolar NPN transistor Q1. Here, $V_{BE}$ voltage of bipolar NPN transistor Q1 has a negative temperature coefficient.

At a certain threshold temperature, which can be adjusted by adjusting resistance of R2, the current-difference equals zero. The current comparator 302 transforms the analog signal (e.g., the current difference signal) into a 1-bit output "Out." This result can be further processed with SAR, by means of controlling resistance of R2 implemented as resistive DAC. After 'n' steps, the resulting SAR output corresponds to the temperature value in digital format. Architecture 300 illustrates a current source 301 coupled to Vdd and node B, however, architecture 300 can be modified so that current source 301 is coupled to Vss and node B while resistor R2 is coupled to node B and Vdd. In one such case, Q1 is replaced with a PNP BJT transistor with its emitter terminal coupled to Vdd and its collector terminal coupled to a current source which is further coupled to ground.

Figure 4A:
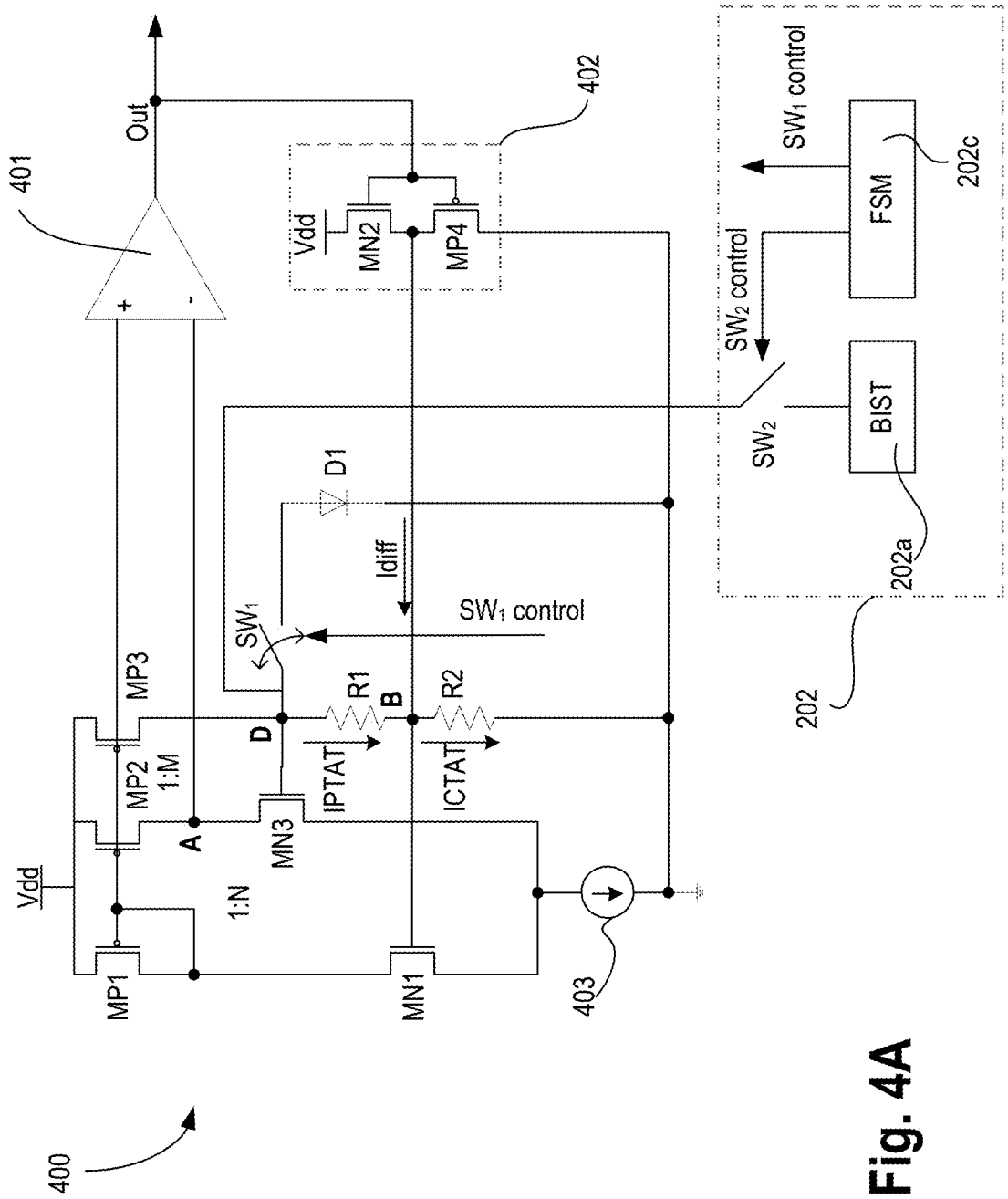
FIG. 4A illustrates an apparatus comprising a metal oxide semiconductor (MOS) based current-mode thermal sensor with apparatus for trimming SF of the thermal sensor, in accordance with some embodiments of the disclosure.

FIG. 4A illustrates an apparatus 400 comprising a MOS based current-mode thermal sensor with apparatus 202 for trimming subthreshold factor of the thermal sensor, in accordance with some embodiments of the disclosure. In one example, MOS based current-mode thermal sensor apparatus 400 comprises p-type transistors MP1, MP2, and MP3 coupled together as shown. Transistors MP1 and MP2 form a current minor, where transistor MP1 is diode-connected (i.e., its gate terminal coupled to its drain terminal). In one such case, transistor MP1 generates a reference current which is mirrored on transistor MP2 which is biased by the same voltage as transistor MP1 because their respective gate terminals are coupled together. Transistor MP2 is sized 'N' times larger than transistor MP1 to up-scale current through transistor MP2 by N times compared to current through transistor MP1. As such, current density ratio of 1:N is achieved. In one example, current value ratio is 1:N when the size (W/L) of transistor MN1 equal to the size (W/L) of transistor MN3, or 1:1 current ratio is achieved when the size of the transistor MN1 relative to the size of transistor MN3 is N:1 or even mixed. Transistor MP3 is also biased by the same gate voltage as gate voltage of transistor MP1. In other embodiments, transistor MP3 is a standalone current source decoupled from current mirror formed of transistors MP1 and MP2. Current through transistor MP3 may be same or different than the currents through transistors MP1 and/or MP2.

In some embodiments, comparator 301 is an amplifier which can be a general amplifier (e.g., multi-stage amplifier). In one example, amplifier 401 can also be a single stage amplifier with single input from node A. In one example, the output signal "Out" of amplifier 401 may be provided to a digital input for further processing directly or via a comparator, a logic gate, or a Schmitt trigger. In one example, resistors R1 and R2 of MOS based current-mode thermal sensor 400 are coupled together in series with transistor MP3.

In some embodiments, Buffer 402 comprises devices that coupled together provide a non-linear characteristic. Buffer 402 comprises an n-type transistor MN2 coupled in series to a p-type transistor MP4. Here, the drain terminal of transistor MN2 is coupled to Vdd and the source terminal of transistor MN2 is coupled to node B. The source terminal of transistor MP4 is coupled to node B and the drain terminal of transistor MP4 is coupled to ground. In some embodiments, buffer 402 introduces a non-linearity into the transfer curve of the voltage provided to the input of buffer 402 and the current provided at its output to the summing node B. The non-linearity has the effect that the ratio between a given output current swing provided by buffer 402 and the input voltage swing to provide the output current swing is not linear over the input voltage range of buffer 402.

In one example, buffer 402 is configured such that this ratio has its minimum at the point where the polarity of the current changes polarity e.g., around the zero point of the output current, larger input voltage swings are needed to produce a given output current swing than from higher output current values. In one example, there may be a voltage threshold in the control of buffer 402. In such an example, around the zero point of the output current, the input voltage of buffer 402 corresponding to the output voltage "Out" of amplifier 401 has to overcome this voltage threshold before it can cause a change in the output current. In this example, the input voltage of buffer 402 behaves likes a digital signal since all voltages below the threshold voltage no longer occur since they have no effect on the output current and only higher voltage value about the threshold voltage occur.

In some embodiments, MOS based current-mode thermal sensor apparatus 400 comprises an asymmetric differential amplifier using MOS transistors MN1 and MN3 together with current mirror loads MP1 and MP2. In some embodiments, the drain terminal of transistor MN1 is coupled to the drain terminal of transistor MP1, and the source terminal of MN1 is coupled to current source 403. In some embodiments, the drain terminal of transistor MN3 is coupled to the drain terminal of transistor MP2, and the source terminal of transistor MN3 is coupled to current source 403. In some embodiments, the current through current source 403 is Ibias. In some embodiments, the gate terminal of transistor MN3 is coupled to node D while the gate terminal of transistor MN1 is coupled to node B. In one example, a diode D1 is coupled in parallel to resistors R1 and R2 i.e., diode D1 is in parallel to node D when switch $SW_1$ is closed. For example, the anode of diode D1 is coupled to node D via switch $SW_1$ and the cathode of diode D1 is coupled to ground (Vss).

In this example, IPTAT is not generated by $V_{BE}$ of NPN transistor Q2, but is generated by MOS transistor MN3 operating in weak inversion mode. The IPTAT is also generated by gate voltage difference between MN3 and MN1. In some embodiments, transistor MN1 also operates in weak inversion mode. In one example, transistors MN1 and MN3 operate in weak inversion mode by making transistors MN1 and MN3 large devices (e.g., their W/Ls are substantially larger than W/Ls of other transistors of sensor 400). In another example, lower current can be used to make devices in weak inversion. In some embodiments, all the transistors are in weak inversion not just transistors MN1 and MN3. In some embodiments, transistors MN1 and MN3 are operated in weak inversion mode by keeping current density of these devices low enough so that exponential current law, instead of square current law, is valid for these devices.

In some embodiments, the core function is generated by MOS transistors MN1 and MN3, which operate in weak-inversion and at different current densities (ratio 1:N). In one example, weak-inversion in devices MN1 and MN3 is achieved by specific device ratio, or by forcing a different current ratio, or both. In some embodiments, when switch $SW_1$ is closed and switch $SW_2$ is open, transistor MP3 provides a current to diode D1 and also resistor R1 such that the voltage drop over resistor R1 keeps the differential pair in equilibrium. In this example, there is no positive feedback loop (through MP3). For instance, all feedback happens through buffer 402 only, which stabilizes IPTAT.

In some embodiments, resistor R1 is coupled between the gates of 'N' ratio-ed transistors MN1 and MN3, the corresponding delta-Vgate-voltage is PTAT and results in a strictly temperature-proportional current, IPTAT, which can be expressed as:

$$IPTAT = \frac{Vg1 - Vg3}{R1} = \eta \cdot Vt \cdot \frac{\ln(N)}{R1} \qquad \text{Eq. 7}$$

where Vt=thermal voltage (=k*T/q), η=sub threshold factor, and Vg1 and Vg3 are the gate voltages of MN1 and MN3, respectively. This method of PTAT generation is useful for FinFet technologies, where η equals to 1.

In one example, diode D1 which is coupled in parallel to the PTAT branch via switch $SW_1$, effectively clamps node D to a fixed voltage Vg3 with CTAT behaviour. Here, diode D1 defines a common mode level. In one example, transistor MP3 provides just a bias current to diode D1 and resistor R1. In one example, transistor MP3 is not involved in feedback control. In one example, the value of tail current Ibias is a replica of current through MP3 may be created by a simple PTAT current source to get a predictable temperature slope. In one example, Ibias is generated by a self-biased loop. In one example, when Ibias is provided by current source 403, sensor 400 achieves startup and can operate for its normal function. In such an embodiment, a special startup circuit may not be used.

In one example, diode D1 may be realized by a diode-connected bipolar device (e.g. "substrate-PNP"), a device which produces a voltage drop with negative temperature coefficient, Schottky-contact diode, a discrete diode, a lateral bipolar diode, a diode formed from an MOS transistor, or a BJT based diode. The above list of diodes is not meant to be an exclusive list. Other forms of diode or diode behaving elements can be used for realizing diode D1.

In some embodiments, biasing current for diode D1 is provided by, or by other means. In one embodiment, due to the feedback loop, the voltage at node B (Vg1) is also "CTAT," and equals the voltage-drop of a diode with 'N' times smaller current density than diode D1. In one example, since resistor R2 is coupled in parallel to such "virtual diode," it carries a current ICTAT with negative temperature coefficient which can be expressed as:

$$ICTAT = \frac{Vg2}{R2} \qquad \text{Eq. 8}$$

where Vg2 is proportional to the Diode D1 voltage which has negative temperature coefficient. For example, ICTAT is the voltage on node B divided by resistance R2, and where the voltage on node B is the diode voltage subtracted from the gate voltage difference of MN2 and MN1.

In some examples, the "threshold" value of temperature can be adjusted by modifying resistance of resistor R2. In one example, resistance of resistor R2 is modified by digitally controlled switches (e.g., resistor DAC). Continuing with the above explanation, by adding amplifier 401 and buffer 402 as illustrated in sensor 400, a current Idiff is inserted at node B, according to one embodiment. In one example, current Idiff generated by buffer 402 is used to regulate IPTAT, which also stabilizes Vg1 to have CTAT behaviour. In such an example, negative feedback is added, and a stable operating condition is achieved, with:

$$Idiff = ICTAT - IPTAT = \frac{Vg2}{R2} - \frac{Vt}{R1} \cdot \eta \cdot \ln(N) \qquad \text{Eq. 9}$$

In this example, Idiff of Eq. 9 has a much larger (absolute) temperature coefficient than temperature coefficients of traditional thermal sensors, and so more precise evaluation of temperature is achieved by sensor 400. In one example, Idiff takes on both polarities (e.g., positive and negative) and crosses zero when the temperature matches with the predefined threshold (through resistance of resistor R2).

In some embodiments, a strongly non-linear transfer function is provided between nodes A and B, so that the loop gain reduces drastically at Idiff=0. In one embodiment, this is accomplished by specific coupling of NMOS/PMOS devices, driving Idiff in class AB-type. In such an embodiment, the voltage at OUT switches between two distinctive values and therefore outputs the function of a highly sensitive current comparator.

In one example, all relevant functions of sensor apparatus 400 are established with little sensitivity to MOSFET matching. In such an example, sensor apparatus 400 achieves high precision without extra circuits for error correction, like increased area, chopping or auto-zero techniques. In one example, the most sensitive PTAT signal is regulated through main feedback loop and does not depend on matching of transistor MP3. In one example, overall linearity of sensor apparatus 400 is hardly affected by mismatch of current mirror transistors MP1 and MP2 due to the large $g_m$ of transistors MN1 and MN3.

In contrast to traditional thermal sensors, the examples process currents instead of voltages for thermal measurement and evaluation. This enables high (e.g., unlimited) dynamic range and avoids limitations with voltage headroom. In one example, MOS based current-mode thermal sensor apparatus 400 does not include any open loop control, with subsequent provision for error correction. For example, different tasks of generating a temperature dependent signal, providing a reference and comparison, are all accomplished at once within a feedback loop. The above features account for low sensitivity to mismatch errors, and therefore higher accuracy.

Depending on the comparison result, MOS based current-mode thermal sensor apparatus 400 flips between two operating states, therefore comprising a bi-stable behavior. In one example, MOS based current-mode thermal sensor apparatus 400 allows analog-to-digital conversion by applying a simple successive approximation algorithm ("SAR"). For example, a single comparator output is provided which compares the temperature signal against a threshold value. This threshold can be adjusted by digital numbers, which inherently represents the main ADC functionality.

In one example, a processor can have multiple sensors like sensor apparatus 400 dispersed throughout the processor for sensing temperatures at various parts of the processor. In one example, outputs of each sensor can be processed by a power management unit (PCU) to control various features of the processor e.g., power supply level, operating frequency, external thermal control (e.g., fan speed control), etc. In one example, sensor apparatus 400 is implemented as an on-die thermal sensor. In other examples, sensor apparatus 400 is implemented as an off-die thermal sensor.

Figure 4B:
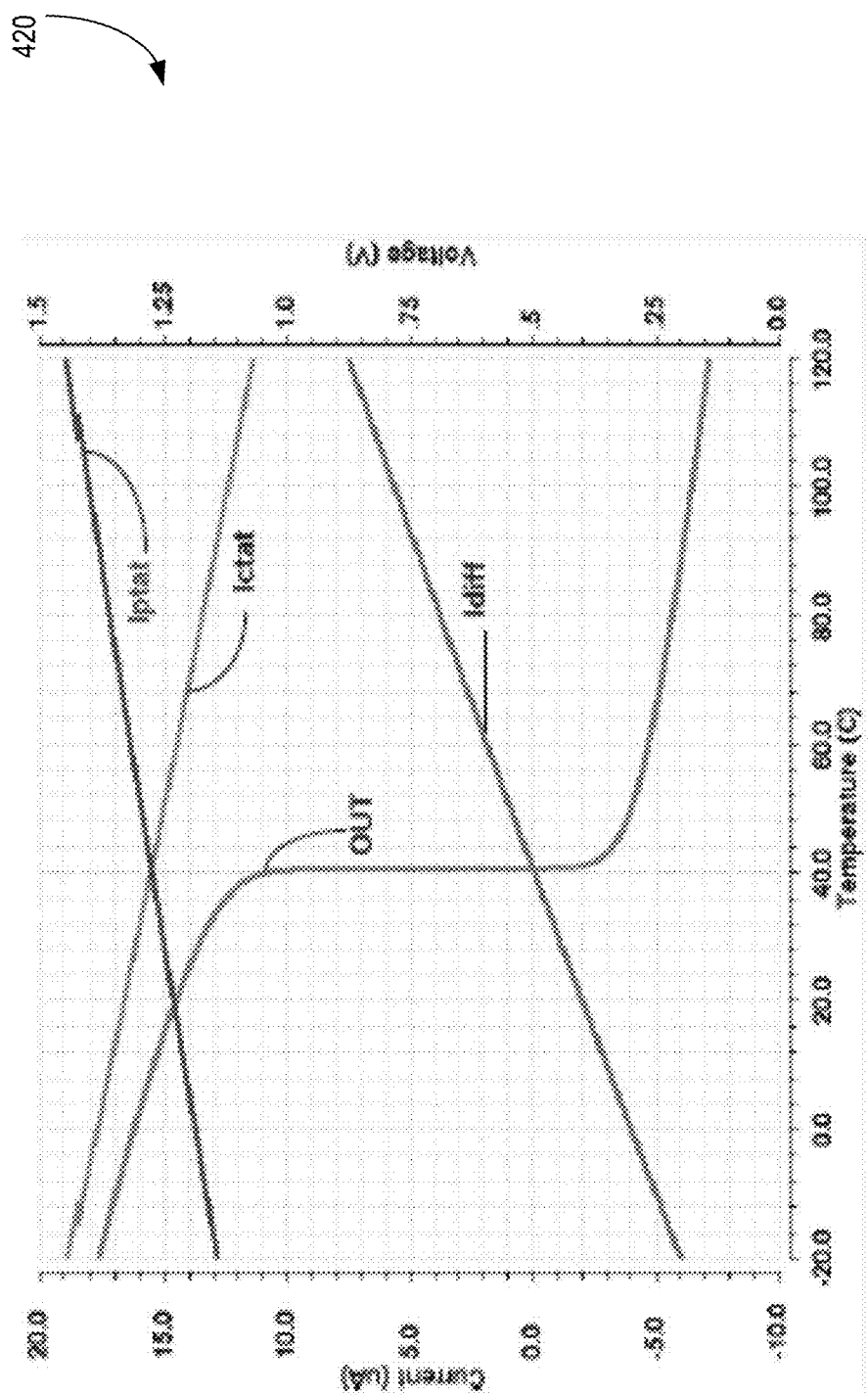
FIG. 4B illustrates a plot showing normal operation of the thermal sensor, in accordance with some embodiments of the disclosure.

FIG. 4B illustrates plot 420 showing normal operation of the thermal sensor, in accordance with some embodiments of the disclosure. Here, the x-axis is temperature in Celsius (C), the y-axis on the left side is current (μA), and the y-axis on the right side is voltage (V). Plot 420 indicates IPTAT and ICTAT as a function of temperature. In one embodiment, when IPTAT and ICTAT are substantially equal (or identical), Idiff is sensed as zero (or substantially zero). In one embodiment, node "OUT" acts like a digital signal, switching sharply between positive and negative MOS threshold when Idiff changes polarity. In one embodiment, the DAC settings for resistor R2 (which determine the temperature threshold) indicate the sensed temperature. Idiff at zero-crossing point can be expressed as:

$$Idiff = IPTAT - ICTAT = \frac{1}{R1} \cdot \frac{kT}{e}\ln(N) - \frac{Vg1}{R2} = 0; \Rightarrow \quad \text{Eq. 10}$$

$$T = \frac{Vgo}{\frac{R2}{R1} \cdot \frac{k \cdot \ln(N)}{e}} - tc$$

where, Vgo is a constant of approximately 1.2V and related to the silicon bandgap extrapolated to 0 K), "tc" is the temperature coefficient of diode D1 and is approximately 2 mV/K.

In one example, if the negative feedback (node A towards B) has a strong nonlinear transfer characteristic exactly at Idiff=0, then it includes effectively the function of a current comparator. This behavior is accomplished by transistors MP2 and MP3 in the specific configuration, working similar like two anti-parallel diodes.

Figure 5:
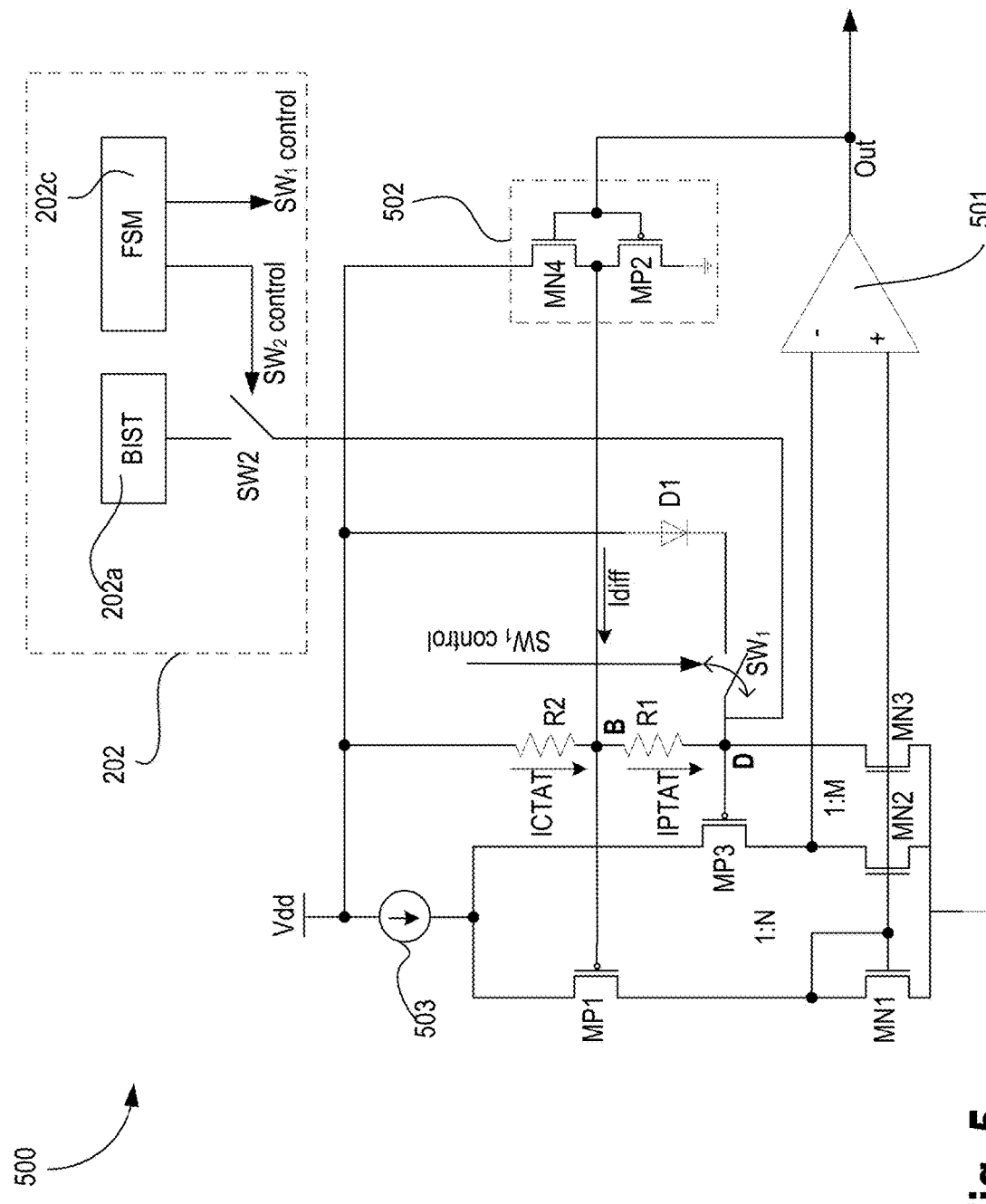
FIG. 5 illustrates a MOS based current-mode thermal sensor with apparatus for trimming SF of the thermal sensor, in accordance with some embodiments of the disclosure.

FIG. 5 illustrates apparatus 500 with a MOS based current-mode thermal sensor and with apparatus 202 for trimming subthreshold factor of the thermal sensor, in accordance with some embodiments of the disclosure. The example of MOS based current-mode thermal sensor is similar to the example of MOS based current-mode thermal sensor of apparatus 400 except that the design is a complementary design using n-type current mirror, p-type differential pair, and n-type current source to generate Ibias. MOS based current-mode thermal sensor is functionally equivalent to MOS based current-mode thermal sensor of apparatus 400.

So as not to obscure the examples, functional details of each device/component of sensor of apparatus 500 are not discussed because they are similar to that of sensor of apparatus 400. In one example, current-mode thermal sensor of apparatus 500 comprises amplifier 501 (functions similar to amplifier 401), buffer 502 (which functions similar to buffer 402), current source 503 to generate Ibias (which functions similar to current source 403), differential p-type transistors MP1 and MP3 (which function similar to differential n-type transistors MN1 and MN3), n-type current mirror loads MN1 and MN2 (which function similar to p-type current mirror loads MP1 and MP2), n-type current source MN3 (which functions similar to p-type current source MP3), resistor R1 (same as resistor R1 of FIG. 4A), resistor R2 (which is same as resistor R2 of FIG. 4A), and diode D1 which is same as diode D1 of FIG. 4A.

In this example, the anode of diode D1 is coupled to Vdd and the cathode of diode D1 is coupled to node D via switch SW$_1$. In this embodiment, resistor R2 is coupled between Vdd and node B and resistor R1 is coupled between nodes B and D. Here, transistor MN4 of buffer 502 has its drain terminal coupled to Vdd and source terminal coupled to node B. In this example, the source terminal of MP2 is coupled to node B while the drain terminal of transistor MP2 is coupled to ground. In this embodiment, current source 503 is coupled between Vdd and common node of transistors MP1 and MP3.

In the absence of switches SW$_1$ and SW$_2$, and apparatus 202, the hybrid thermal sensor (HTS) of FIGS. 2-4 have strong accuracy dependency on subthreshold factor (SF) variation during process manufacturing. In some embodiments, the SF parameter is extracted at an arbitrary temperature (room temperature, for example) and the variation in the SF is compensated with minimal power, silicon, and testing cost overhead.

Figure 6A:
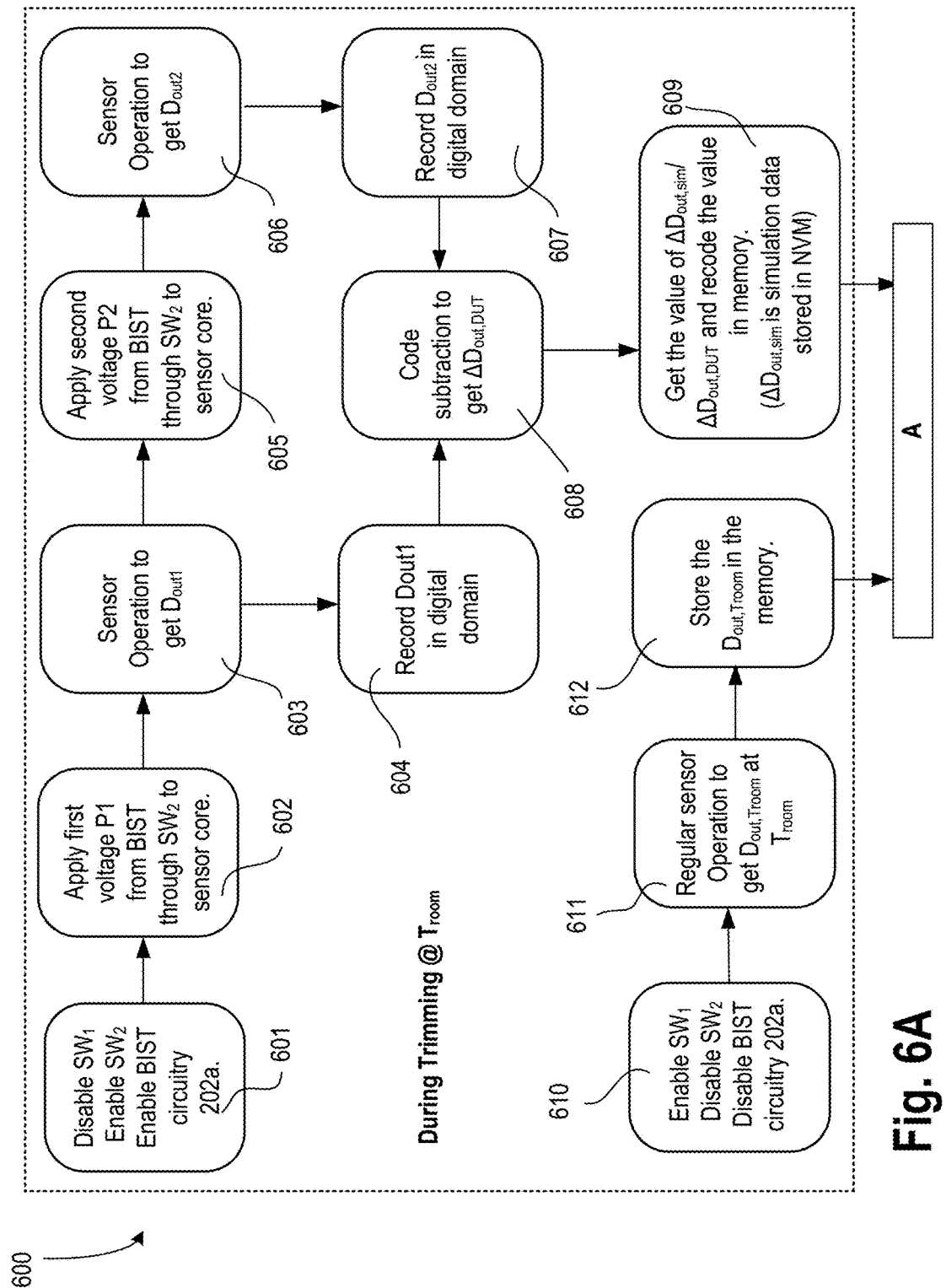
FIGS. 6A-B illustrate processes for trimming SF of the thermal sensor, in accordance with some embodiments of the disclosure.
Figure 6B:
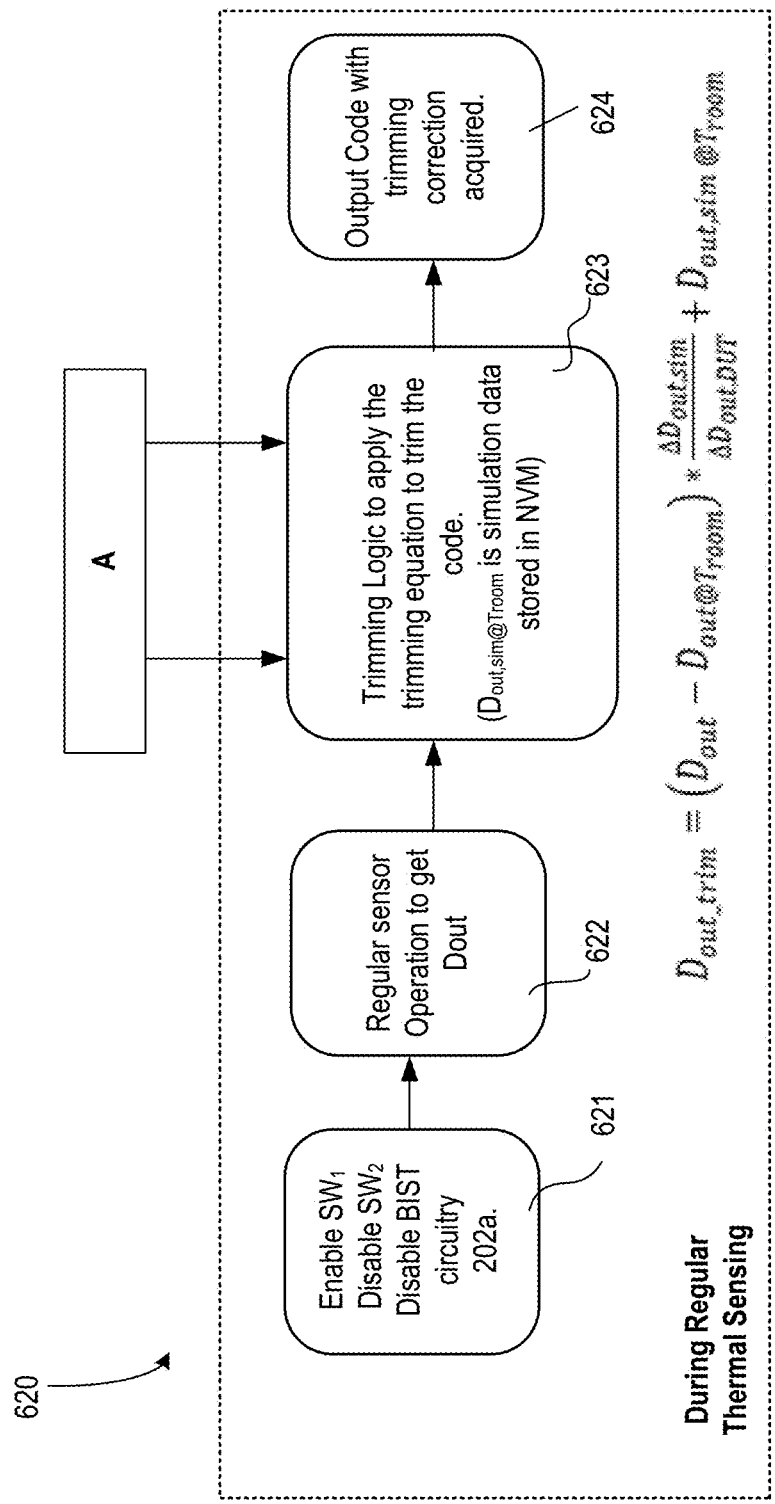

FIGS. 6A-B illustrate processes 600 and 620, respectively, for trimming subthreshold factor of the thermal sensor, in accordance with some embodiments of the disclosure.

At block 601, switch SW$_1$ is disabled (e.g., opened) and switch SW$_2$ is enabled (e.g., closed) to electrically couple the BIST circuitry to the HTS. At block 602, a first voltage P1 is applied by the BIST circuitry 202a through switch SW$_2$ to the HTS core. HTS then operates, and at block 603 it provides an output D$_{out1}$ in response to the applied voltage P1. At block 604, the output D$_{out1}$ of HTS is stored. For example, D$_{out1}$ is stored in a non-volatile memory (NVM). In some embodiments, D$_{out1}$ is stored in the digital domain where it is later processed.

At block 605, a second voltage P2 is applied by the BIST circuitry 202a through switch SW$_2$ to HTS core. HTS then operates, and at block 606 it provides an output D$_{out2}$ in response to the applied voltage P2. At block 607, the output D$_{out2}$ of HTS is stored. For example, D$_{out2}$ is stored in a non-volatile memory (NVM). In some embodiments, D$_{out2}$ is stored in the digital domain where it is later processed.

At block 608, the two Dout values (D$_{out1}$ and D$_{out2}$) are subtracted to achieve $\Delta D_{out,DUT}$. At block 609, a previously stored simulation value for $\Delta D_{out, DUT}$, referred to as $\Delta D_{out, sim}$, is extracted and used. For example, $\Delta D_{out, sim}$ is stored in a non-volatile memory (e.g., a lookup table) and read from the non-volatile memory. A ratio of $\Delta D_{out, sim}$ and $\Delta D_{out, DUT}$ is then determined (e.g., $\Delta D_{out, sim}/\Delta D_{out, DUT}$) and the ratio is stored in non-volatile memory.

At block 610, switch SW$_1$ is enabled (e.g., closed) and switch SW$_2$ is disabled (e.g., opened), and BIST circuitry 202a is disabled. At block 611, the HTS operates in normal mode and generates D$_{out, Troom}$ at room temperature (T$_{room}$). The value of D$_{out, Troom}$ is then stored in a non-volatile memory at block 612.

At block 621, switch SW$_1$ is enabled and switch SW$_2$ is disabled, and BIST circuitry 202a is disabled. At block 622, HTS operates in normal mode and Dout is achieved. At block 623, trimming logic applies the trimming equation 6 (Eq. 6) to trim the code. As such, at block 624, the output code with trimming correction is acquired and applied to the HTS to correct or compensate for varying SF.

Figure 7:
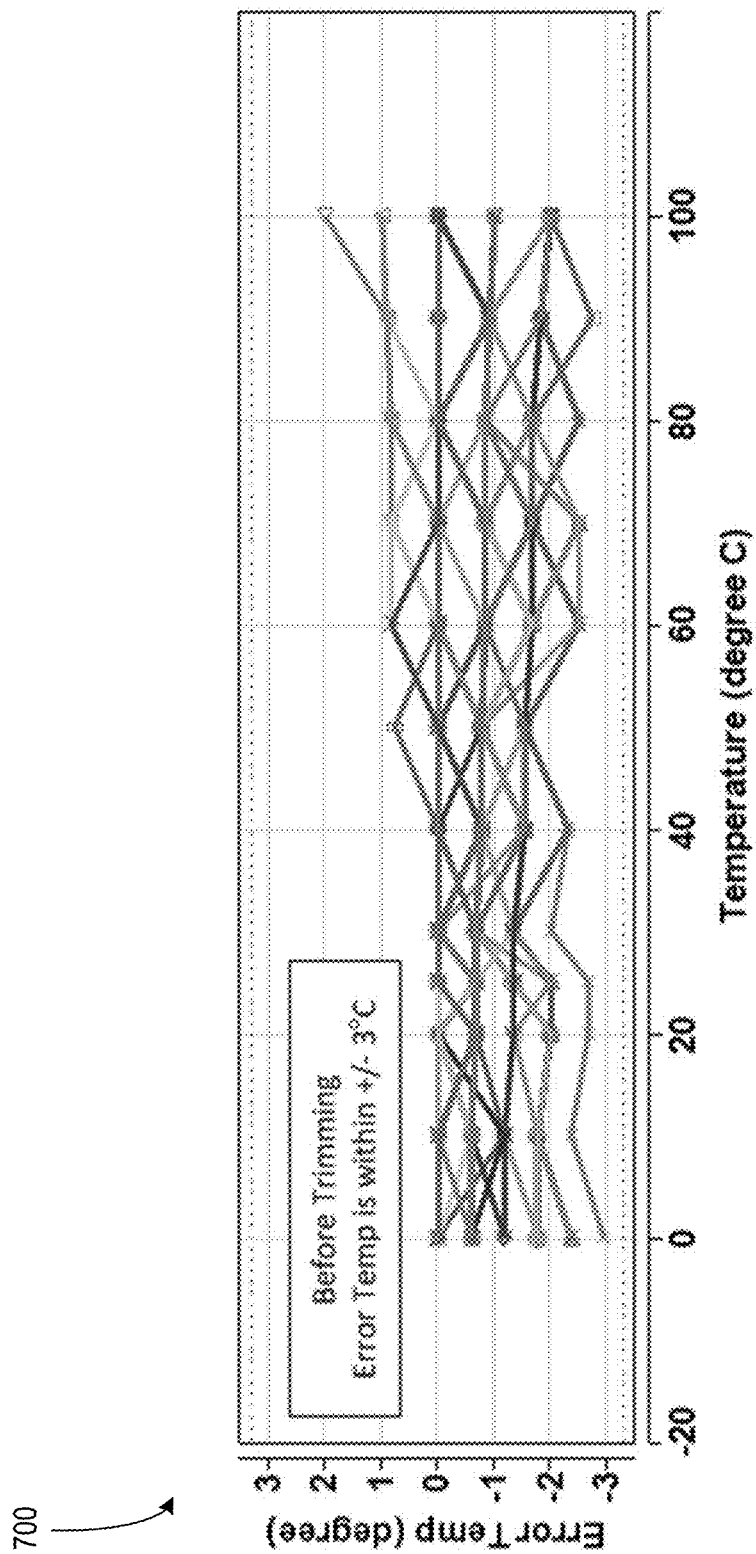
FIG. 7 illustrates a plot showing error in temperature reading from the thermal sensor without SF trimming.
Figure 8:
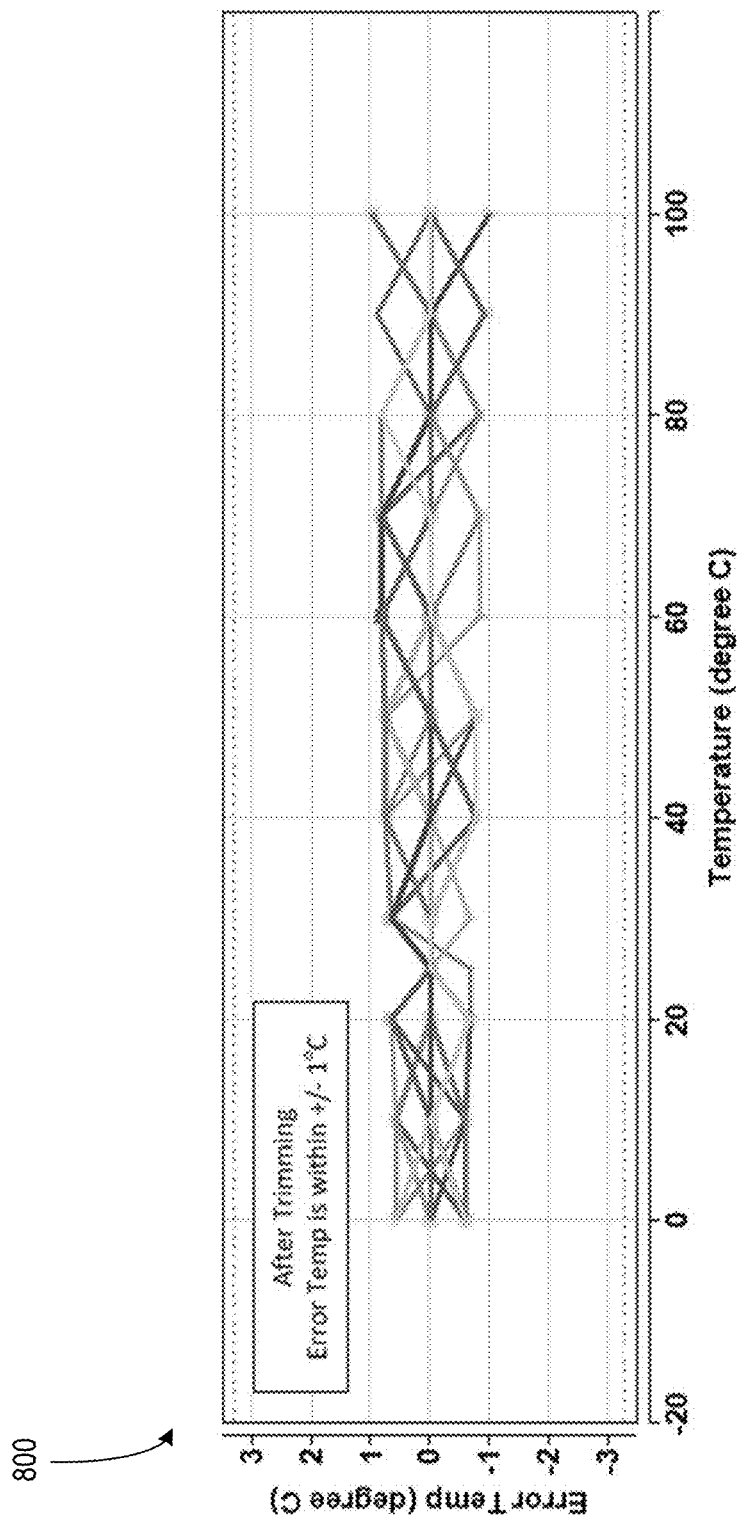
FIG. 8 illustrates a plot showing reduced error in temperature reading from the thermal sensor with SF trimming, in accordance with various embodiments.

FIG. 7 illustrates plot 700 showing error in temperature reading from the thermal sensor without SF trimming. FIG. 8 illustrates plot 800 showing reduced error in temperature reading from the thermal sensor with SF trimming, in accordance with various embodiments. These plots show the silicon measurement of the HTS implementation without transistor upsizing to reduce the SF variation before and after the SF trimming technique. The sensing inaccuracy is improved from ±3° C. to ±1° C., which fully meets the design requirements (less than ±3 degree). With some embodiments, the HTS can fully support the Moore's law since the device upsizing to reduce SF variation is no longer a design need. Furthermore, the product cost is reduced significantly because of the elimination of requirement of temperature control modules in the test floor to perform the current two-temperature-point trimming. In various embodiments, BIST circuitry 202a is merely turned on during trimming and trimming logic 202b can be integrated in firmware.

Figure 9:
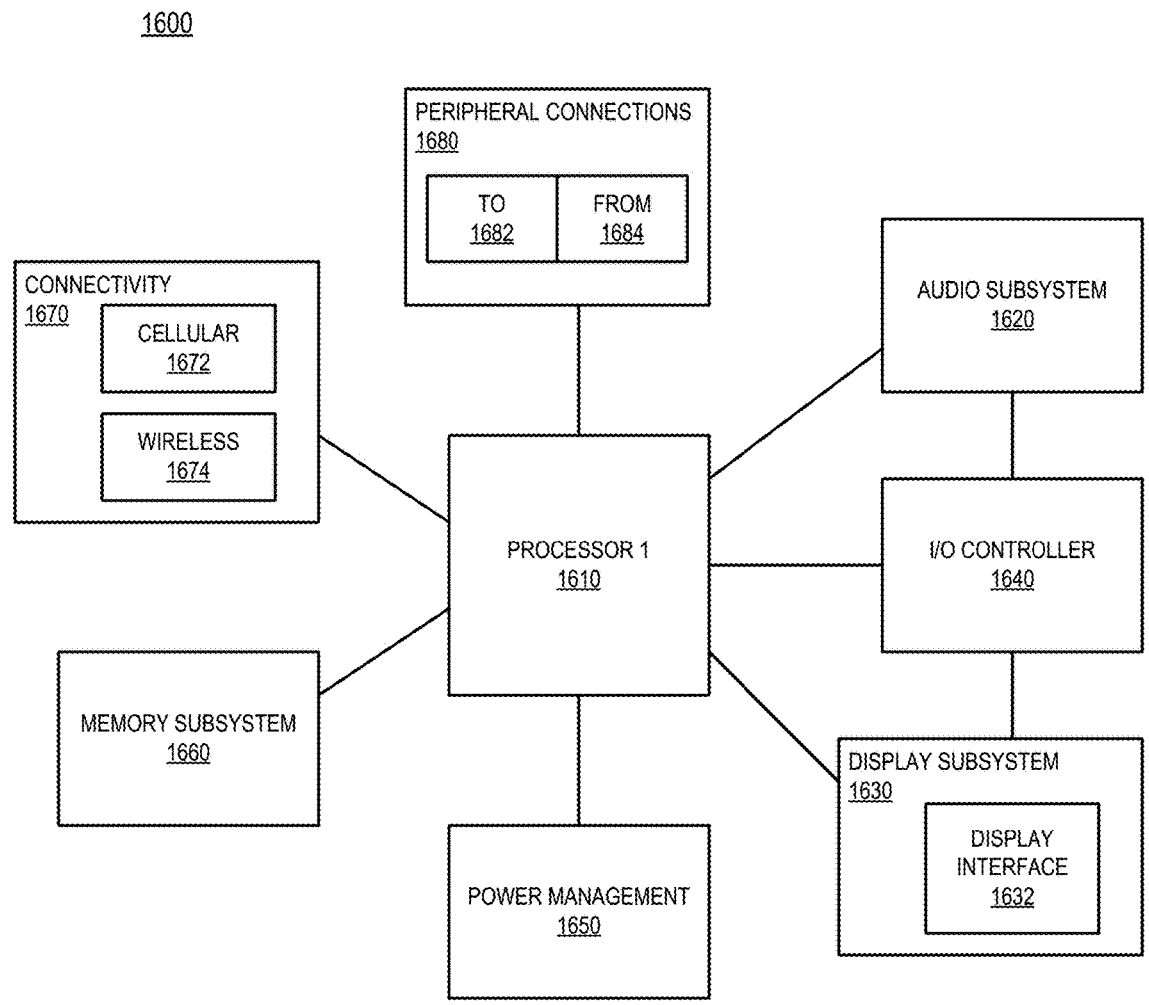
FIG. 9 illustrates a smart device or a computer system or a SoC (System-on-Chip) having an apparatus for SF trimming of the thermal sensor, according to some embodiments of the disclosure.

FIG. 9 illustrates a smart device or a computer system or a SoC (System-on-Chip) having an apparatus for SF trimming of a thermal sensor, according to some embodiments of the disclosure. The block diagram is, for example, of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 having the apparatus for SF trimming of the thermal sensor, according to some embodiments discussed. Other blocks of the computing device 1600 may also include apparatus for SF trimming of the thermal sensor, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   a first circuitry to compare a proportional-to-absolute-temperature (PTAT) voltage and a complementary-to-absolute-temperature (CTAT) voltage;
   an analog-to-digital converter (ADC) coupled to the first circuitry, wherein the ADC is to provide a digital code that is representative of a temperature;
   a second circuitry to generate temperature independent first and second voltages;
   a first switch coupled to a node that is to provide the CTAT voltage; and
   a second switch coupled to the second circuitry and to the node providing the CTAT voltage, wherein the second switch is to provide one of the first or second voltages.

2. The apparatus of claim 1, wherein the PTAT voltage is derived from one or more n-type devices or p-type devices in weak inversion.

3. The apparatus of claim 1, wherein the CTAT voltage is generated by a p-n junction diode.

4. The apparatus of claim 1 comprises logic to trim the digital code for subthreshold factor variation, wherein the output of the logic is a trimmed digital code.

5. The apparatus of claim 1 comprises a finite state machine, wherein the first and second switches are controllable by the finite state machine.

6. The apparatus of claim 1, wherein the ADC is to implement a successive approximation algorithm.

7. The apparatus of claim 1, wherein the first circuitry is part of a thermal sensor, and wherein the secondary circuitry is part of a built-in-self-test circuitry.

8. The apparatus of claim 1 comprises:
   a first memory to store the digital code during a first temperature;
   a second memory to store the digital code when the second switch is closed and the first switch is open; and
   a third memory to store the digital code when the second switch is opened and the first switch is closed.

9. The apparatus of claim 8, wherein the first, second, and third memories are non-volatile memories.

10. An apparatus comprising:
    a thermal sensor comprising one or more n-type devices or p-type devices that suffer from subthreshold factor variation, wherein the thermal sensor is to generate an output digital code that is representative of a temperature; and
    a calibration circuitry coupled to the thermal sensor, wherein the calibration circuitry is to trim the effects of subthreshold factor variation from the output digital code.

11. The apparatus of claim 10, wherein thermal sensor comprises:
  a first circuitry to compare a proportional-to-absolute-temperature (PTAT) voltage and a complementary-to-absolute-temperature (CTAT) voltage; and
  an analog-to-digital converter (ADC) coupled to the first circuitry, wherein the ADC is to provide the output digital code that is representative of the temperature.

12. The apparatus of claim 11, wherein the PTAT voltage is derived from the one or more n-type devices or p-type devices, and wherein the CTAT voltage is generated by a p-n junction diode.

13. The apparatus of claim 11, wherein the calibration circuitry comprises a second circuitry to generate temperature independent first and second voltages.

14. The apparatus of claim 13, wherein the thermal sensor comprises a first switch coupled to a node that is to provide the CTAT voltage.

15. The apparatus of claim 14, wherein the calibration circuitry comprises a second switch coupled to the second circuitry and to the node that is to provide the CTAT voltage, and wherein the second switch is to provide one of the first and second voltages.

16. The apparatus of claim 14, wherein the calibration circuitry comprises a finite state machine, and wherein the first and second switches are controllable by the finite state machine.

17. The apparatus of claim 11, wherein the ADC is to implement a successive approximation algorithm.

18. A system comprising:
  a memory;
  a processor coupled to the memory, the processor including a bandgap reference circuit which includes:
    a thermal sensor comprising one or more n-type devices or p-type devices that suffer from subthreshold factor variation, wherein the thermal sensor is to generate an output digital code that is representative of a temperature; and
    a calibration circuitry coupled to the thermal sensor, wherein the calibration circuitry is to trim the effects of subthreshold factor variation from the output digital code; and
  a wireless interface to allow the processor to communicate with another device.

19. The system of claim 18, wherein thermal sensor comprises:
  a first circuitry to compare a proportional-to-absolute-temperature (PTAT) voltage and a complementary-to-absolute-temperature (CTAT) voltage; and
  an analog-to-digital converter (ADC) coupled to the first circuitry, wherein the ADC is to provide the output digital code representing the temperature, wherein the PTAT voltage is derived from the one or more n-type devices or p-type devices, and wherein the CTAT voltage is generated by a p-n junction diode.

20. The system of claim 19, wherein the calibration circuitry comprises a second circuitry to generate temperature independent first and second voltages, wherein the thermal sensor comprises a first switch coupled to a node that is to provide the CTAT voltage, wherein the calibration circuitry comprises a second switch coupled to the second circuitry and to the node providing the CTAT voltage, and wherein the second switch is to provide one of the first and second voltages.

* * * * *